United States Patent
Choi

Patent Number: 5,804,504
Date of Patent: Sep. 8, 1998

[54] METHOD FOR FORMING WIRING OF SEMICONDUCTOR DEVICE

[75] Inventor: Yang Kyu Choi, Kyoungki-do, Rep. of Korea

[73] Assignee: Hyundai Electronics Industries Co., Ltd., Ichon, Rep. of Korea

[21] Appl. No.: 834,295

[22] Filed: Apr. 15, 1997

Related U.S. Application Data

[63] Continuation of Ser. No. 541,101, Oct. 11, 1995, abandoned.

[30] Foreign Application Priority Data

Oct. 12, 1994 [KR] Rep. of Korea .................. 1994 26085

[51] Int. Cl.$^6$ ............................................. H01L 21/4763
[52] U.S. Cl. ...................... 438/637; 438/659; 438/675; 438/685; 438/945
[58] Field of Search ..................... 438/623, 637, 438/659, 674, 675, 677, 685, 720, 742, 945

[56] References Cited

U.S. PATENT DOCUMENTS

| | | | |
|---|---|---|---|
| 4,619,037 | 10/1986 | Taguchi et al. | 437/195 |
| 4,670,091 | 6/1987 | Thomas et al. | 156/643 |
| 5,102,826 | 4/1992 | Oshima et al. | 437/192 |
| 5,529,953 | 6/1996 | Shoda | 437/195 |

FOREIGN PATENT DOCUMENTS

| | | | |
|---|---|---|---|
| 63-95649 | 4/1988 | Japan | 437/203 |
| 63-227037 | 9/1988 | Japan | 437/192 |
| 64-82620 | 3/1989 | Japan | 437/192 |
| 82620 | 3/1989 | Japan | 437/192 |
| 6-53166 | 2/1994 | Japan | 437/192 |

*Primary Examiner*—Olik Chaudhuri
*Assistant Examiner*—Kevin F. Turner
*Attorney, Agent, or Firm*—Reid & Priest LLP

[57] ABSTRACT

A method for forming an upper metal wiring which is in contact with an under conductive layer in a highly integrated semiconductor device. The method includes the steps of forming a metal wiring layer on a lower insulating film, forming a contact hole in the insulating film to expose an under conductive layer, and growing a metal layer in the contact hole to fill up the contact hole, so that the metal wiring layer can be in contact with the lower conductive layer.

10 Claims, 6 Drawing Sheets

METHOD FOR FORMING WIRING OF SEMICONDUCTOR DEVICE

This is a continuation of U.S. application Ser. No. 08/541,101 filed Oct. 11, 1995, now abandoned.

BACKGROUND OF THE INVENTION

1. Field of the Invention

The present invention relates to a method for forming metal wiring of a semiconductor device, and more particularly to a method for forming an upper metal wiring which is in contact with an under conductive layer in a highly integrated semiconductor device.

2. Description of the Prior Art

An increased integration degree of semiconductor devices results in an increase in the aspect ratio, that is, the ratio of the depth of the contact hole to the width of the contact hole. Where a metal wiring, which fill a contact hole and serves as an upper wiring, is made of aluminum with a low melting point, such an increase in aspect ratio involves a degradation in electro migration and stress migration characteristics. Since the topology becomes higher due to the increase in aspect ratio, voids may be formed in the contact hole in the process of filling the metal layer in the contact hole using a deposition method. Furthermore, an unnecessary residue may be left in the process of forming a pattern. In this case, a short circuit may be generated between neighboring patterns. Where the metal wiring is made of tungsten, formation of a poor pattern and generation of particles may occur. As a result, there is a possibility that a short circuit occurs.

Typically, the formation of such an upper metal wiring is achieved by forming a contact hole, forming a metal layer filling the contact hole and then etching the metal layer. An example of a conventional method for forming a metal wiring which is in contact with an under conductive layer will now be described in conjunction with FIGS. 1A to 1C.

Referring to FIG. 1A, a semiconductor substrate 1 is shown, in which a diffusion region 2 is defined. An insulating film 3 is formed over the semiconductor substrate 1.

On the insulating film 3, a contact mask 4 is then formed, as shown in FIG. 1B. Using the contact mask 4, the insulating film 3 is etched at its portion corresponding to a contact region, thereby forming a contact hole 5. Through the contact hole 5, the diffusion region 2 is exposed.

Thereafter, the contact mask 4 is removed, as shown in FIG. 1C. Over the resulting structure, a metal layer is deposited. The metal layer is then etched using a metal wiring mask (not shown), thereby forming a metal wiring 6.

However, this method is adapted to bring the metal wiring into contact with the lower diffusion region after the formation of the contact hole under the condition that the insulating film has a planarized surface. Where the insulating film has a surface with a high topology, a portion of the metal layer may be left after the formation of the metal wiring. A poor contact may also be formed due to voids formed in the contact hole.

SUMMARY OF THE INVENTION

Therefore, an object of the invention is to solve the above mentioned problems and to provide a method for forming metal wiring of a semiconductor device, capable of preventing the metal wiring from being short-circuited or broken by forming the metal wiring on an insulating film before a contact hole is formed in the insulating film, and selectively growing a metal layer to fill up the contact hole after the formation of the contact hole.

In accordance with one aspect, the present invention provides a method for forming a metal wiring of a semiconductor device, comprising the steps of: forming a first conductive layer on a semiconductor substrate; forming an insulating film over the resulting structure obtained after the formation of the first conductive layer, and then forming a metal wiring mask on the insulating film; partially etching the insulating film to a desired thickness by use of the metal wiring mask, thereby forming a groove, and then implanting silicon ions in the bottom portion of the groove, thereby forming a silicon implanted region; removing the metal wiring mask, and then selectively growing tungsten in the groove, thereby forming a first selectively-grown tungsten layer; forming a contact mask on the resulting structure obtained after the formation of the first tungsten layer, and then etching the first tungsten layer and the insulating film by use of the contact mask, thereby forming a contact hole for exposing the first conductive layer; and removing the contact mask, and then selectively growing tungsten in the contact hole, thereby forming a second selectively-grown tungsten layer filling the contact hole, whereby the first tungsten layer as an upper conductive layer is electrically connected to the first conductive layer.

In accordance with another aspect, the present invention provides a method for forming a metal wiring of a semiconductor device including a semiconductor substrate provided with diffusion regions and element-isolating films, a first conductive layer formed over the semiconductor substrate, a first insulating film formed on the resulting structure obtained after the formation of the first conductive layer, the first insulating film having a planarized surface, a plurality of spaced second conductive layers, a second insulating film over the resulting structure obtained after the formation of the first insulating film, and the metal wiring being in contact with the diffusion regions and the second conductive layers, comprising the steps of: partially etching the second insulating film to a desired thickness by use of a metal wiring mask, thereby forming grooves, and then implanting silicon ions in respective bottom portion of the grooves, thereby forming silicon-implanted regions; selectively growing tungsten in the grooves, thereby forming first selectively-grown tungsten layers; etching the first selectively-grown tungsten layers, the second insulating film and the first insulating film by use of a contact mask, thereby forming contact holes respectively for exposing the second conductive layers and the diffusion regions; selectively growing tungsten in the contact holes, thereby forming second selectively-grown tungsten layers respectively filling the contact holes, whereby each of the first tungsten layers is electrically connected to each associated diffusion region and each associated second conductive layer.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

FIGS. 2A to 2E are sectional views respectively illustrating sequential steps of a method for forming a metal wiring of a semiconductor device in accordance with a first embodiment of the present invention.

Figure 1A:
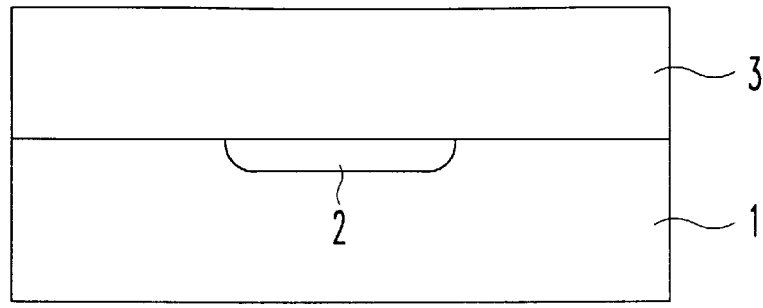
FIGS. 1A to 1C are sectional views respectively illustrating a conventional method for forming a metal wiring of a semiconductor device.
Figure 1B:
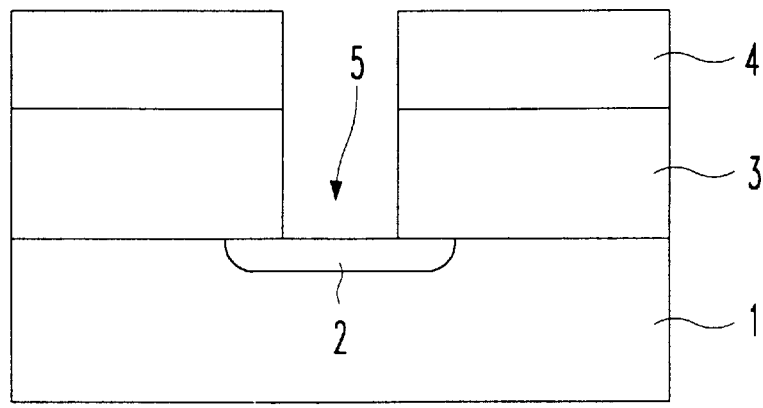
Figure 1C:
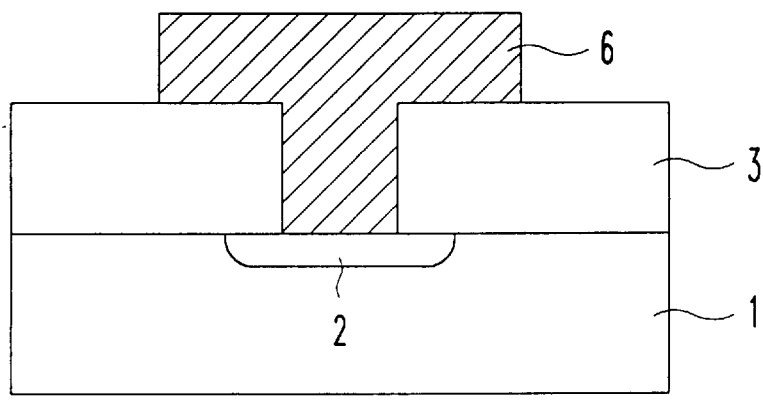
Figure 2A:
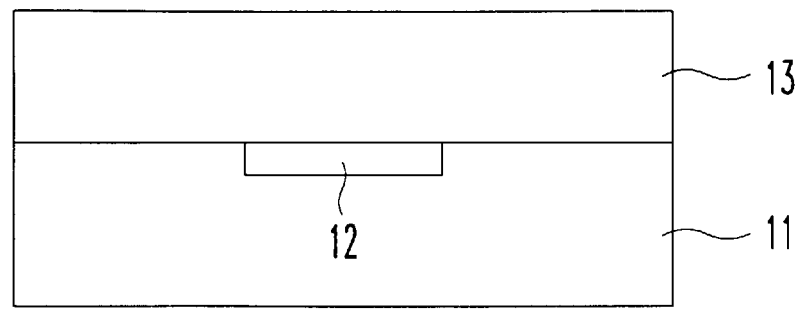
FIGS. 2A to 2E are sectional views respectively illustrating sequential steps of a method for forming a metal wiring of a semiconductor device in accordance with a first embodiment of the present invention.

In accordance with the embodiment of the present invention, a semiconductor substrate 11 is prepared, in which a diffusion region 12 is defined, as shown in FIG. 2A. An insulating film 13 is formed over the semiconductor substrate 11.

Figure 2B:
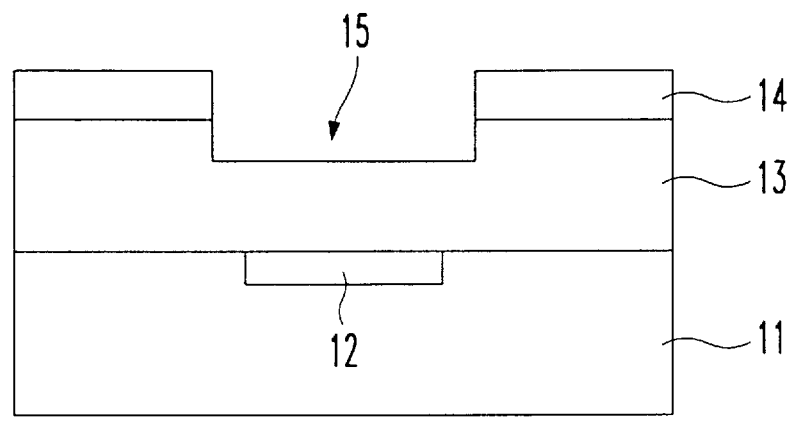

Thereafter, a metal wiring mask 14 is formed on the insulating film 13, as shown in FIG. 2B. Using the metal wiring mask 14, a desired portion of the insulating film 13 is etched to a thickness corresponding to a desired metal wiring's thickness, thereby forming a groove 15 which is longitudinally elongated.

Figure 2C:
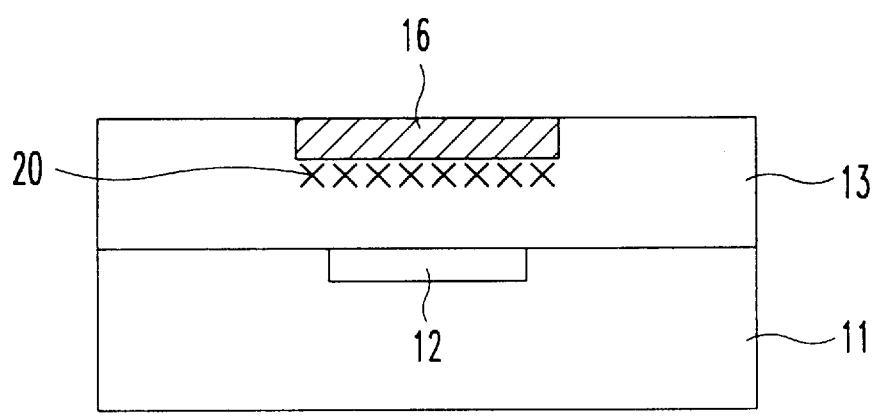

Silicon ions are then implanted in the bottom portion of the groove 15, thereby forming a silicon-implanted region 20 which will serve as a reaction seed at a subsequent step of depositing tungsten, as shown in FIG. 2C. Thereafter, the metal wiring mask 14 is removed. A tungsten layer 16 is then grown in the groove 15. In order to increase the growth rate of tungsten, phosphor (P), boron (B) or arsenic (As) may be additionally implanted in the silicon-implanted region 20.

Figure 2D:
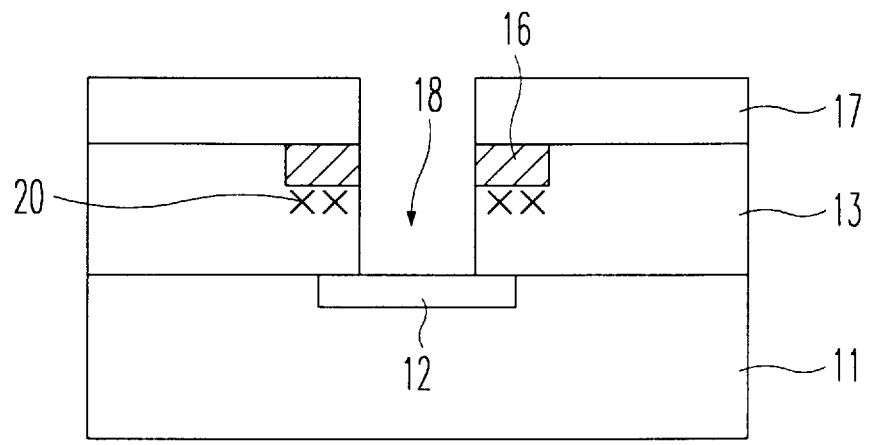

On the resulting structure, a contact mask 17 is then formed as shown in FIG. 2D. Using the contact mask 17, the selectively-grown tungsten layer 16 and insulating film 13 are partially etched at their portions corresponding to a contact hole region, thereby forming a contact hole 18 through which the diffusion region 12 is exposed.

Figure 2E:
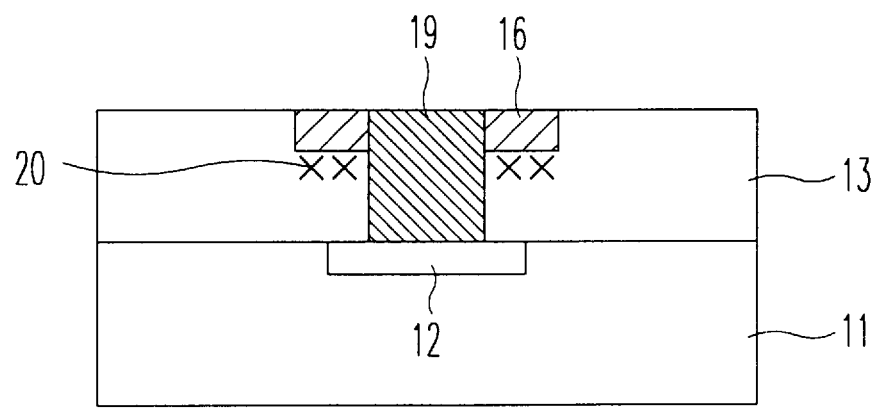

After completing the formation of the contact hole 18, the contact mask 17 is removed, as shown in FIG. 2E. Subsequently, another tungsten layer 19 is selectively grown in the contact hole 18 such that the contact hole 18 is completely filled with tungsten, thereby causing the upper conductive layer, namely, the selectively-grown tungsten layer 16 to be electrically connected to the lower diffusion region 12. It should be noted that no void is formed during the filling of the contact hole 18 because the tungsten layer 19 is grown at a higher rate than that of the tungsten layer 16.

FIGS. 3A to 3F illustrate sequential steps of a method for forming a metal wiring of a semiconductor device in accordance with a second embodiment of the present invention.

Figure 3A:
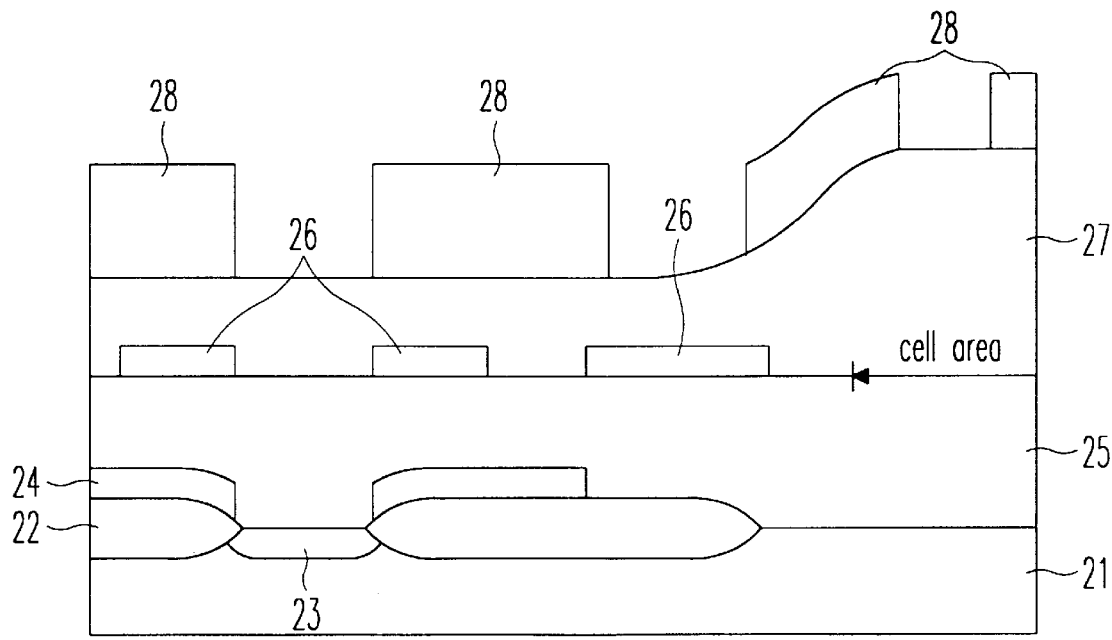
FIGS. 3A to 3F are sectional views respectively illustrating sequential steps of a method for forming a metal wiring of a semiconductor device in accordance with a second embodiment of the present invention.

In accordance with this embodiment of the present invention, a semiconductor substrate 21 is prepared, in which spaced element-isolating films 22 are formed, as shown in FIG. 3A. Between adjacent element isolating films 22, a diffusion region 23 is formed. A first conductive layer 24, which may be comprised of a polysilicon film is overlapped with each element isolating film 22. Over the resulting structure, a first insulating film 25 is then formed. A plurality of spaced second conductive layers 26 each comprised of, for example, a polysilicon film is formed on the first insulating film 25. A second insulating film 27 is then formed over the resulting structure. In the process of carrying out the above step, cells are formed at cell regions. After completing this step, a metal wiring mask 28 is formed on the second insulating film 27.

Figure 3B:
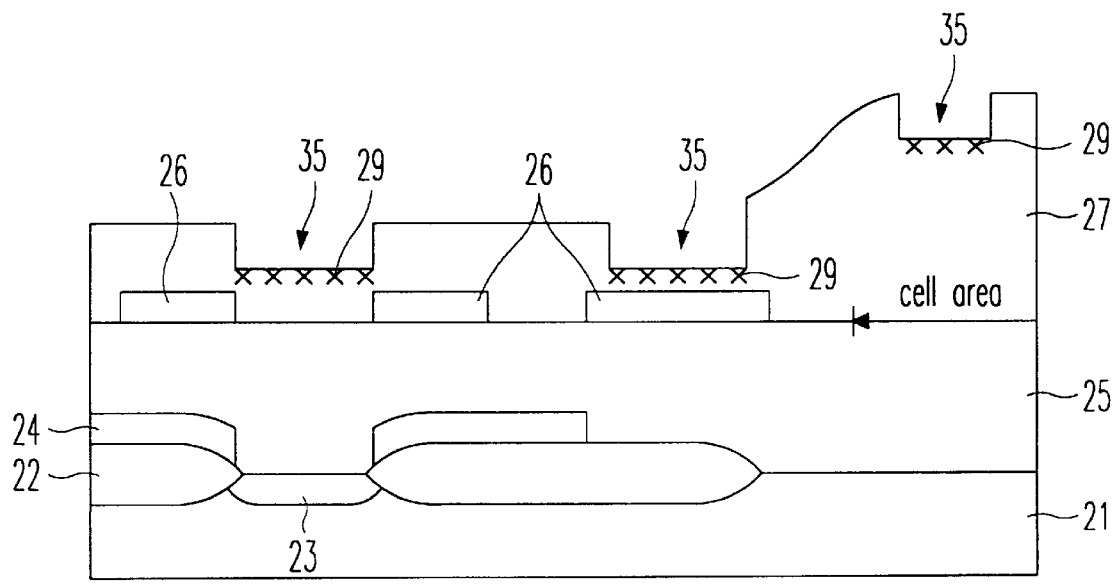

Using the metal wiring mask 28, desired portions of the second insulating film 27 are etched to a thickness corresponding to a desired metal wiring's thickness, thereby forming grooves 35, as shown in FIG. 3B. Silicon ions are then implanted in the bottom portion of each groove 35, thereby forming a silicon-implanted region 29 which will serve as a reaction seed at a subsequent step of depositing tungsten. Thereafter, the metal wiring mask 28 is removed. In order to increase the growth rate of tungsten, phosphor, boron or arsenic may be additionally implanted in the silicon-implanted region 29.

Figure 3C:
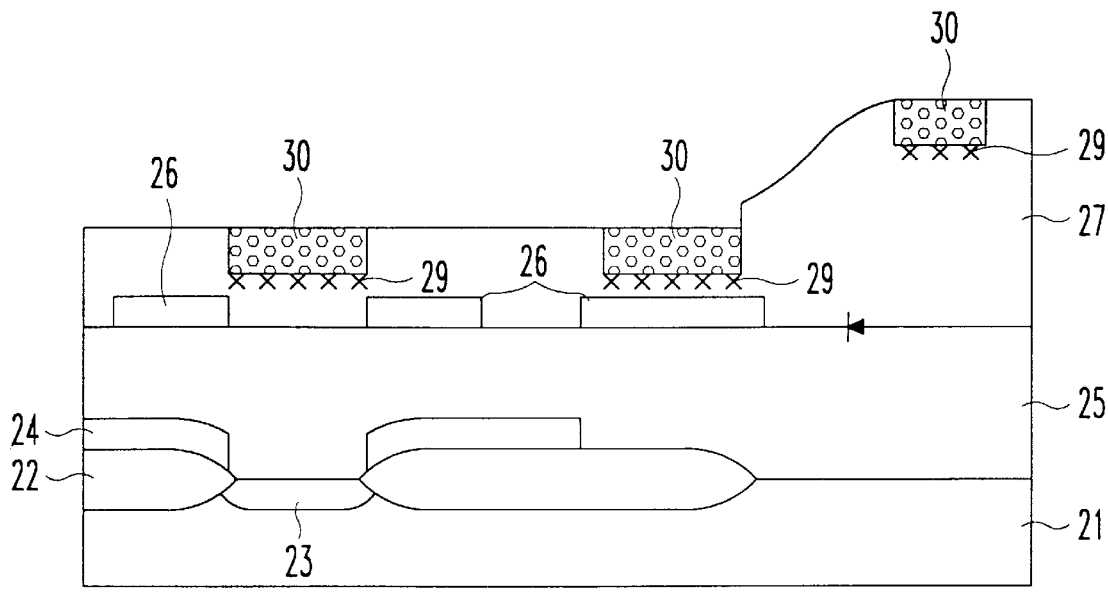

Thereafter, a tungsten layer 30 is then selectively grown in each groove 35, as shown in FIG. 3C. The tungsten layer 30 will be used as an upper conductive layer. Since the tungsten layer 30 is selectively grown in the groove 35, a planarization effect can be obtained, even when no separate planarization is carried out, in the manufacture of semiconductor devices involving the double-, tri- or multi-level metal process.

Figure 3D:
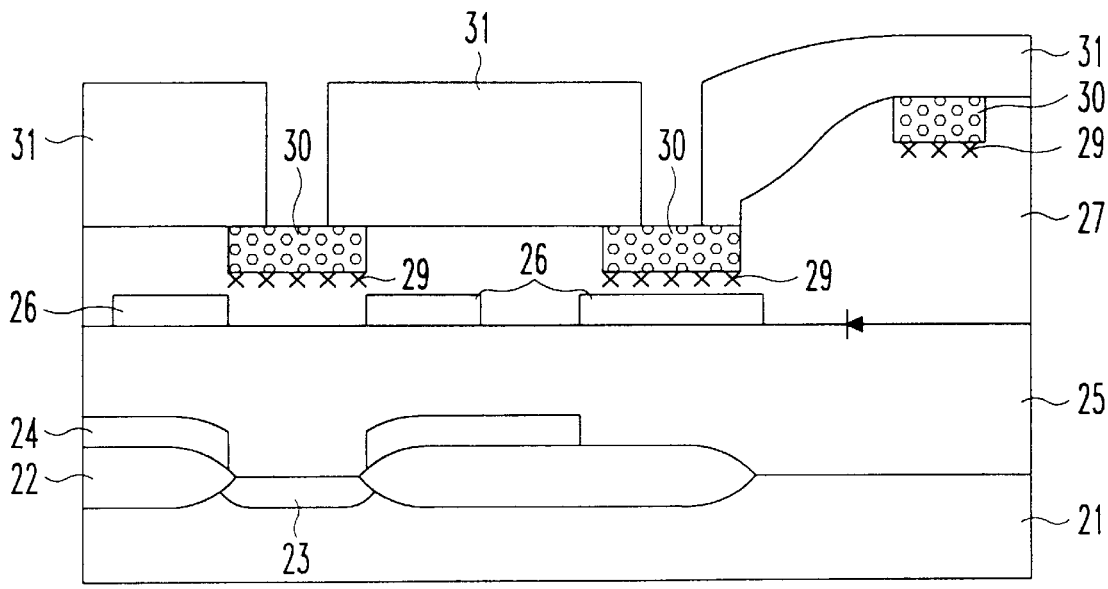

On the resulting structure, a contact mask 31 is then formed such that the selectively-grown tungsten layer 30 is exposed, as shown in FIG. 3D.

Figure 3E:
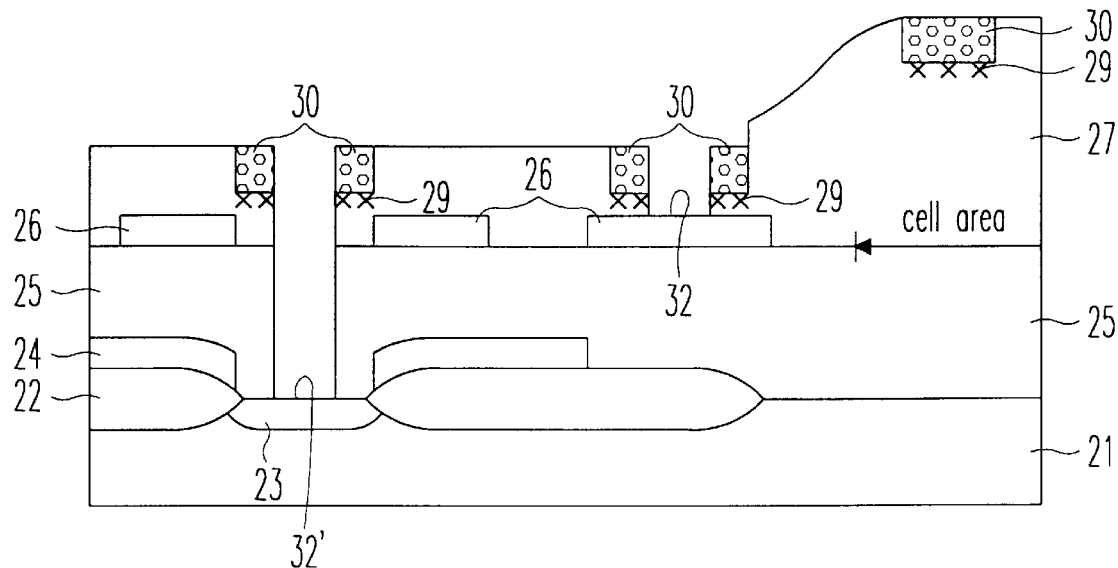

Using the contact mask, the selectively-grown tungsten layer 30 and second insulating film 27 are partially etched at their portions corresponding to a contact hole region, thereby forming a contact hole 32 through which the associated second conductive layer 26 is exposed, as shown in FIG. 3E. Subsequently, an exposed portion of the first insulating film 25 is etched, thereby forming a contact hole 32' through which the diffusion region 23 is exposed.

Figure 3F:
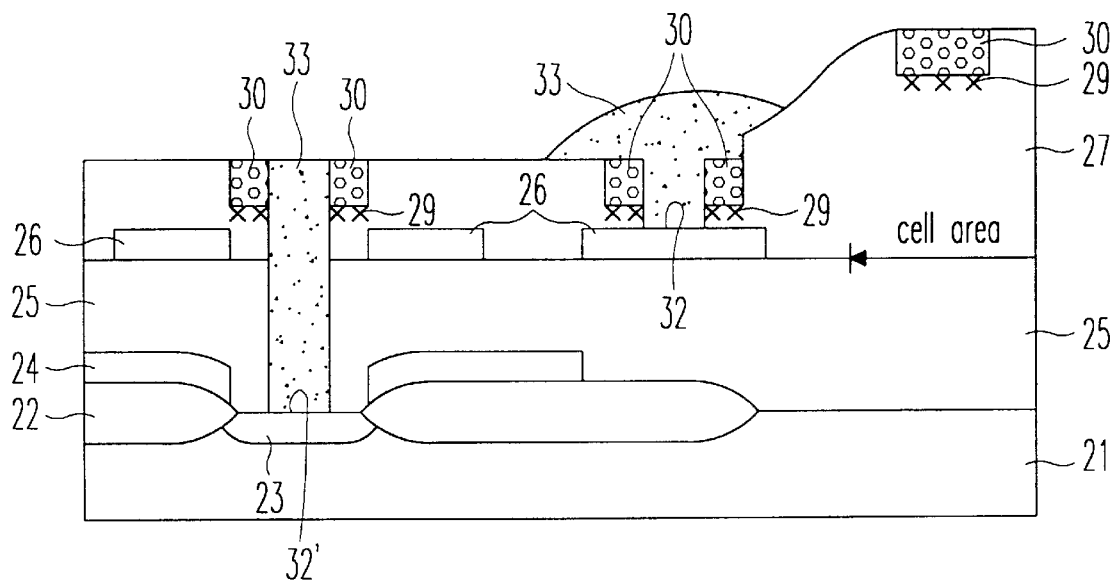

Respective tungsten layers 33 are then selectively grown in the contact holes 32 and 32' such that they are electrically connected to the diffusion region 23 or second conductive layer 26, as shown in FIG. 3F. In this case, the growth of tungsten is carried out with reference to the deepest contact hole 32'. Accordingly, the tungsten is over-grown in the contact hole 32. It should be noted that no void is formed during the filling of the contact holes 32 and 32' because the tungsten layer 33 on the diffusion region 23 or second conductive layer 26 is grown at a higher rate than that of the tungsten layer 30 to be used as a metal wiring.

As apparent from the above description, the present invention provides a method for forming a metal wiring of a semiconductor device, capable of preventing an unnecessary residual from being left in the process of forming a pattern due to the topology of the under layer and preventing voids from being formed in a contact hole. Accordingly, it is possible to prevent the metal wiring from being short-circuited or broken.

Although the preferred embedments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a metal wiring of a semiconductor device, comprising the steps of:

forming a first conductive layer on a semiconductor substrate;

forming an insulating film having a first thickness over the resulting structure obtained after the formation of the first conductive layer, and then forming a metal wiring mask on the insulating film;

partially etching a groove having a depth less than said first thickness into the insulating film by use of the metal wiring mask, and then implanting silicon ions in a bottom portion of the groove, thereby forming a silicon-implanted region;

removing the metal wiring mask, and then selectively growing tungsten in the groove, thereby forming a first selectively-grown tungsten layer;

forming a contact mask on the resulting structure obtained after the formation of the first tungsten layer, and then etching a contact hole through a portion of the firs tungsten layer and a portion of the insulating film by use of the contact mask, thereby forming a contact hole exposing the first conductive layer; and removing the contact mask, and then selectively growing tungsten in the contact hole, thereby forming a second selectively grown tungsten layer filling the contact hole, whereby the first tungsten layer as an upper conductive layer is electrically connected to the first conductive layer.

2. The method in accordance with claim 1, wherein the first conductive layer is a diffusion region.

3. The method in accordance with claim 1, wherein said depth of said groove is approximately equal to a thickness of said first tungsten layer.

4. The method in accordance with claim 1, further comprising the step of additionally implanting phosphor, boron or arsenic in the silicon-implanted region formed at the bottom portion of the groove.

5. A method for forming a metal wiring of a semiconductor device including a semiconductor substrate provided with diffusion regions and element-isolating films, a first conductive layer formed over the semiconductor substrate, a first insulating film formed on the resulting structure obtained after the formation of the first conductive layer, the first insulating film having a planarized surface, a plurality of spaced second conductive layers, a second insulating film having a first thickness over the resulting structure obtained after the formation of the first insulating film and the metal wiring being in electrical contact with the diffusion regions and the second conductive layers, comprising the steps of:

partially etching grooves having depths less than said first thickness into the second insulating film by use of a metal wiring mask, and then implanting silicon ions in respective bottom portions of the grooves, thereby forming silicon-implanted regions;

selectively growing tungsten in the grooves, thereby forming first selectively-grown tungsten layers;

etching contact holes through portions of the first selectively-grown tungsten layers, the second insulating film and the first insulating film by use of a contact mask, thereby forming contact holes respectively for exposing the second conductive layers and the diffusion regions;

selectively growing tungsten in the contact holes, thereby forming second selectively-grown tungsten layers respectively filling the contact holes, whereby each of the first tungsten layers is electrically connected to each associated diffusion region and each associated second conductive layer.

6. The method in accordance with claim 5, wherein said contact holes exposing said diffusion regions are deeper than said contact holes exposing said second conductive layers and wherein the step of selectively growing tungsten in the contact holes is performed to fill the deeper contact holes exposing said diffusion regions, while over-filling the contact holes exposing said second conductive layers.

7. The method in accordance with claim 5, wherein tungsten is selectively grown in the grooves such that a planarization effect is obtained.

8. The method in accordance with claim 5, further comprising the step of additionally implanting phosphor, boron or arsenic in the silicon-implanted regions respectively formed at the bottom portions of the grooves.

9. The method in accordance with claim 1, wherein the second selectively-grown tungsten layer is grown on the first conductive layer.

10. The method in accordance with claim 5, wherein the second selectively-grown tungsten layers are grown on the diffusion region.

* * * * *